United States Patent
Sorrieul et al.

(10) Patent No.: US 9,472,692 B2
(45) Date of Patent: Oct. 18, 2016

(54) PROCESS OF FABRICATION OF ELECTRONIC DEVICES AND ELECTRONIC DEVICE WITH A DOUBLE ENCAPSULATION RING

(71) Applicant: STMicroelectronics (Grenoble 2) SAS, Grenoble (FR)

(72) Inventors: Marika Sorrieul, Montaud (FR); Karine Saxod, Les Marches (FR)

(73) Assignee: STMICROELECTRONICS (GRENOBLE 2) SAS, Grenoble (FR)

( * ) Notice: Subject to any disclaimer, the term of this patent is extended or adjusted under 35 U.S.C. 154(b) by 0 days.

(21) Appl. No.: 14/834,923

(22) Filed: Aug. 25, 2015

(65) Prior Publication Data

US 2016/0163884 A1  Jun. 9, 2016

(30) Foreign Application Priority Data

Dec. 9, 2014 (FR) ..................... 14 62110

(51) Int. Cl.
H01L 27/00 (2006.01)
H01L 31/0203 (2014.01)
(Continued)

(52) U.S. Cl.
CPC ....... *H01L 31/0203* (2013.01); *H01L 23/3135* (2013.01); *H01L 24/97* (2013.01); *H01L 27/14618* (2013.01); *H01L 31/186* (2013.01); *H01L 31/1876* (2013.01); *H01L 23/3121* (2013.01); *H01L 24/16* (2013.01); *H01L 24/29* (2013.01); *H01L 24/48* (2013.01); *H01L 24/73* (2013.01); *H01L 2224/16225* (2013.01); *H01L 2224/29011* (2013.01); *H01L 2224/48091* (2013.01); *H01L 2224/48235* (2013.01);

(Continued)

(58) Field of Classification Search
CPC ................. H01L 2924/00; H01L 2924/15311; H01L 2924/00014; H01L 2224/48227; H01L 2224/32225; H01L 2224/48091; H01L 2224/48465; H01L 2224/73265; H01L 27/14618; H01L 31/0203
See application file for complete search history.

(56) References Cited

U.S. PATENT DOCUMENTS 6,483,030 B1  11/2002  Glenn et al.
2011/0024861 A1*  2/2011  Tu ..................... H01L 27/14618
                                                             257/434

(Continued)

FOREIGN PATENT DOCUMENTS

JP   S61222384 A   10/1986
KR   101467699 B1  12/2014

OTHER PUBLICATIONS

INPI Search Report and Written Opinion for FR 1462110 dated Nov. 17, 2015 (7 pages).

*Primary Examiner* — Whitney T Moore
*Assistant Examiner* — Joseph Galvin, III
(74) *Attorney, Agent, or Firm* — Gardere Wynne Sewell LLP

(57) ABSTRACT

An integrated circuit chip is mounted on top of a base wafer, and a protection wafer is mounted on top of the integrated circuit chip. An encapsulation block is formed around the integrated circuit chip and the protection wafer and on a peripheral part of the front face of the base wafer. The encapsulation block includes a first encapsulation ring arranged around the integrated circuit chip and the protection wafer, having an annular beading protruding with respect to the front face of the protection wafer and forming a peripheral groove (24) recessed with respect to this protruding annular beading. A second encapsulation ring of the encapsulation block fills the peripheral groove of the first encapsulation ring.

18 Claims, 3 Drawing Sheets

(51) Int. Cl.
*H01L 27/146* (2006.01)
*H01L 31/18* (2006.01)
*H01L 23/31* (2006.01)
*H01L 23/00* (2006.01)

(52) U.S. Cl.
CPC ........... *H01L2224/73207* (2013.01); *H01L 2224/73215* (2013.01); *H01L 2224/97* (2013.01); *H01L 2924/15311* (2013.01); *H01L 2924/15313* (2013.01)

(56) References Cited

U.S. PATENT DOCUMENTS

2011/0291215 A1* 12/2011 Tu .................... H01L 27/14618
257/433
2012/0326332 A1* 12/2012 Laurent ................ H01L 21/565
257/777
2015/0011038 A1* 1/2015 Huang ............. H01L 27/14618
438/66

* cited by examiner

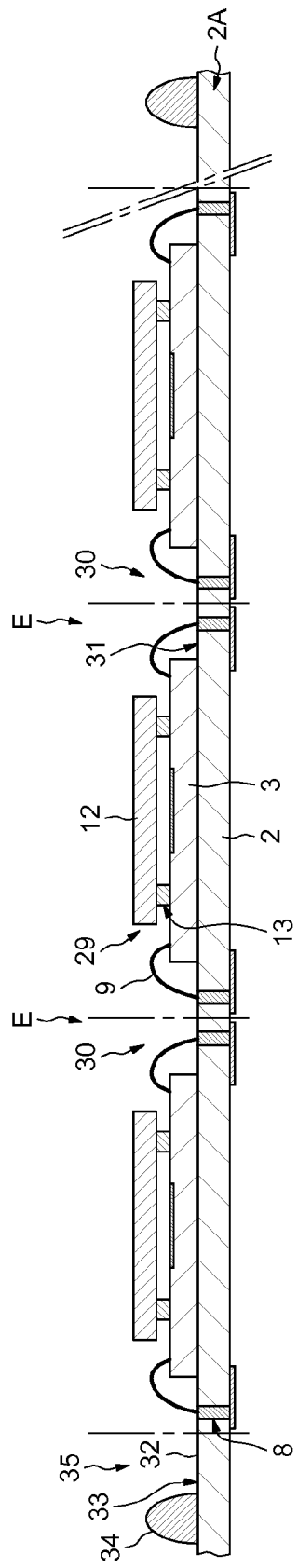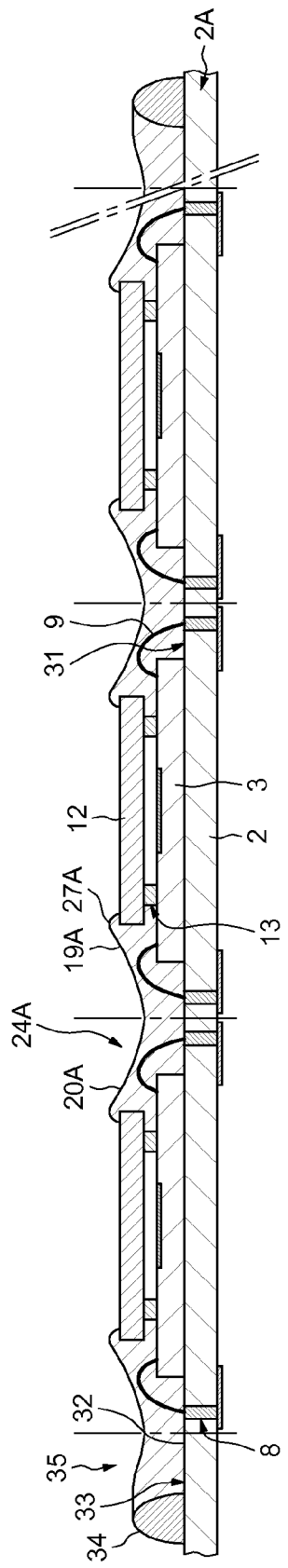

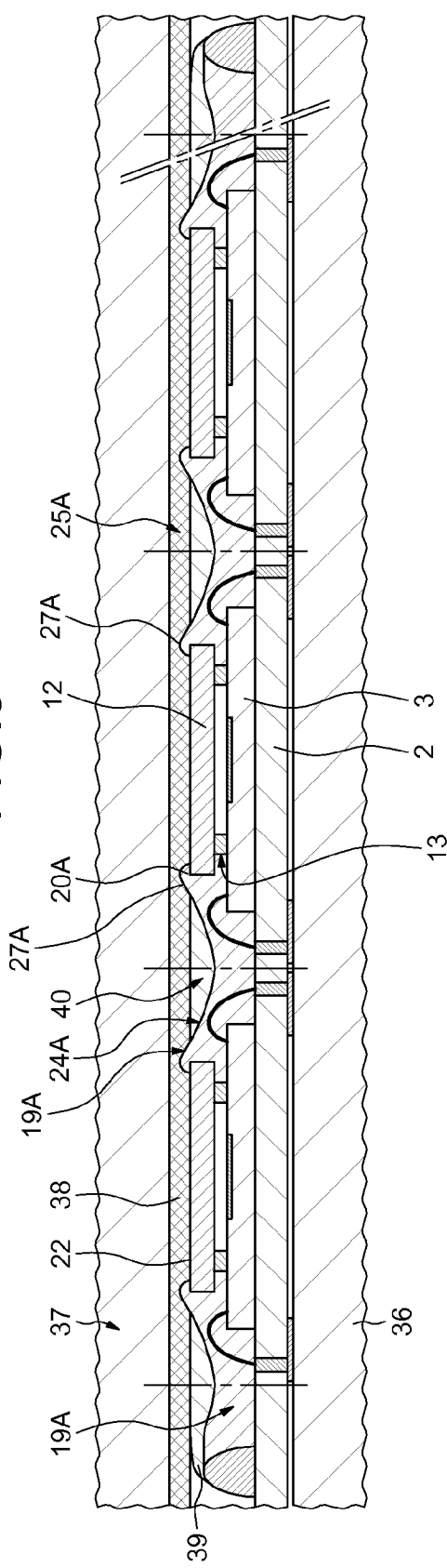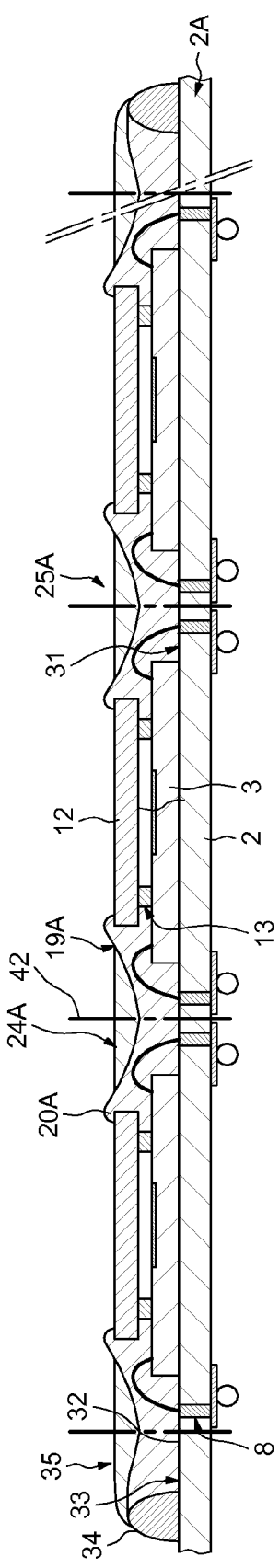

PROCESS OF FABRICATION OF ELECTRONIC DEVICES AND ELECTRONIC DEVICE WITH A DOUBLE ENCAPSULATION RING

PRIORITY CLAIM

This application claims priority from French Application for Patent No. 1462110 filed Dec. 9, 2014, the disclosure of which is incorporated by reference.

TECHNICAL FIELD

The present invention relates to the field of electronic devices which comprise integrated circuit chips.

BACKGROUND

According to a known construction, an electronic device comprises a stacked assembly comprising a base wafer, an integrated circuit chip, mounted onto a front face of this base wafer and including a sensor within its front face, and a protection wafer mounted on top of this front face. Generally, this stacked assembly is surrounded by an encapsulation block.

Such an electronic device, generally resulting from a collective fabrication, notably exhibits difficulties in fabrication so that the front face of the encapsulation block runs substantially in the plane of the front face of the protection wafer.

There is a need in the art to solve such difficulties.

SUMMARY

According to one embodiment, a process is provided for collective fabrication of electronic devices, which comprises: forming a plurality of stacked assemblies respectively on adjacent locations, established in the form of a matrix, of a front face of a base wafer, each stack comprising an integrated circuit chip on top of the base wafer and a protection wafer on top of the chip, in such a manner that channels subsist between the stacked assemblies; forming an outer peripheral barrier on a peripheral area of the front face of the base wafer, around and at a distance from the plurality of stacked assemblies; depositing a first coating material within the channels and hardening this first coating material so as to form a first encapsulation ring, surrounding the stacked assemblies, having protruding annular beading towards the front with respect to the front faces of the protection wafers and situated within annular regions including the peripheral edges of the protection wafers, and forming, along the channels, grooves recessed with respect to the protruding beading; placing one face of a mold in contact on the protruding beading; injecting a second coating material into the recessed grooves and hardening this second coating material so as to form a second encapsulation ring; and carrying out dicing operations along the locations in such a manner as to cut out the individual electronic devices formed in these locations.

The mold can comprise a film of a deformable material, in contact on the protruding beading.

The first encapsulation ring can be made of a deformable material.

A gap may be created between the outer peripheral barrier and the face of the mold.

According to one embodiment, an electronic device is also provided which comprises a base wafer which has a front face; an integrated circuit chip a back face of which is fixed onto the front face of the base wafer; a protection wafer situated on top of the chip; and an encapsulation block arranged around the chip and the protection wafer and on a peripheral part of the front face of the base wafer.

The encapsulation block comprises a first encapsulation ring arranged around the chip and the protection wafer, having a protruding annular beading towards the front with respect to the front face of the protection wafer and situated in an annular region including the peripheral edge of the protection wafer, and forming a peripheral groove recessed with respect to this protruding annular beading; and a second encapsulation ring which fills the peripheral groove of the first encapsulation ring.

The protruding annular beading can extend over a peripheral area of the front face of the protection wafer.

The second encapsulation ring can have a front face situated substantially in the plane of the peak of the protruding annular beading.

A means of assembling the protection wafer at a distance above the chip and of filling a free space can be introduced between the protection wafer and the chip.

The chip can comprise a sensor extending opposite a central region of the protection wafer not covered by the protruding annular beading.

The sensor may be an optical sensor and the protection wafer may be transparent.

BRIEF DESCRIPTION OF THE DRAWINGS

An electronic device and a mode of fabrication of electronic devices will now be described by way of non-limiting examples, illustrated by the drawings in which:

FIGS. 2 to 6 show cross-sections of assemblies corresponding to fabrication steps for the electronic device in FIG. 1.

DETAILED DESCRIPTION

Figure 1:
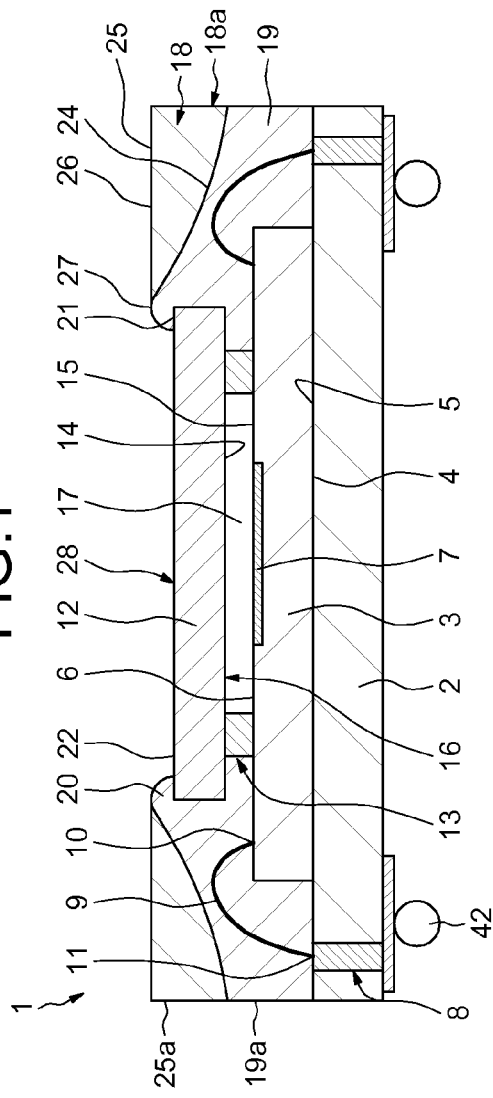
FIG. 1 shows a cross-section of an electronic device, comprising a chip and a protection wafer.

As illustrated in FIG. 1, an electronic device 1 comprises, in a stack, a wafer 2 forming a base and for electrical connection and an integrated circuit chip 3, a back face 4 of which is mounted on a front face 5 of the base wafer 2 by means of a thin layer of adhesive. The surface area of the back face 4, for example square, is smaller than the surface area of the front face 5, for example square. The chip 3 is mounted in the middle of the base wafer 2, their peripheral edges being respectively parallel.

In the central region of its front face 6, the chip 3 comprises a sensor 7, for example an optical sensor.

The wafer forming the base 2 is equipped with an electrical connection network 8. The chip 3 is connected to this electrical connection network 8 by means of a plurality of electrical connection wires 9 which connect front lugs 10, arranged on a peripheral area of the front face 6 of the chip 3, and front lugs 11 of the electrical connection network 8, arranged on a peripheral area of the front face 5 of the base wafer 2, between the peripheral edge of the chip 3 and the peripheral edge of the base wafer 2.

The electronic device 1 further comprises a protection wafer 12, which is generally transparent, stacked onto the chip 3 and which is fixed at a distance from the front face 6 of the chip 3 via an attachment and filling means 13. The peripheral edges of the protection wafer 12 run parallel to the peripheral edges of the chip 3, inside of the peripheral area of the chip 3 including the electrical connection lugs 10.

The attachment and filling means 13 runs between and at a distance from the sensor 7 and from the front lugs 10 of the front face 6 of the chip 3 and over a peripheral area of a back face 14 of the protection wafer 12, such that the front face 6 of the chip 3 has a central region 15, including the sensor 7, situated facing and at a distance from a central region 16 of the back face 14 of the protection wafer 13, while allowing a peripherally bounded free space 17 to subsist between these regions 15 and 16.

According to one exemplary embodiment, the attachment and filling means 13 can comprise an annular ribbon 18 of adhesive, which runs in the form of an open ring surrounding the central region 15 of the front face of the chip 3, where this adhesive may contain solid spacing elements guaranteeing a minimum thickness of the free space 17 and the positioning of the protection wafer with respect to the chip 3.

The electronic device 1 further comprises an annular encapsulation block 18 which is arranged around the chip 3 and the protection wafer 12 and over a peripheral part of the front face 5 of the base wafer 2 and in which the electrical connection wires 9 are buried. This encapsulation block 18 also surrounds the attachment and filling means 13, such that the free space 17 between the chip 3 and the protection wafer 12 is preserved.

The peripheral sides 18a of the encapsulation block 18 and the corresponding peripheral sides of the base wafer 2 respectively run in a common plane perpendicularly to the aforementioned faces of the base wafer 2, such that the electronic device 1 has substantially the shape of a parallelogram parallelepiped.

The encapsulation block 18 comprises a first encapsulation ring 19 which is formed around the chip 3 and the protection wafer 12, and also around the attachment and filling means 13, and on the aforementioned peripheral part of the front face 5 of the base wafer 2 and in which the electrical connection wires 9 are buried.

The first encapsulation ring 19 has an annular beading 20 within the region of the peripheral edge of the protection wafer 12 and protruding towards the front with respect to the front face 22 of the protection wafer 12. According to the example shown, this protruding annular beading 20 extends over a narrow peripheral area 21 of the front face 22 of the protection wafer 12.

The first encapsulation ring 19 forms a peripheral groove 24 that is recessed with respect to the protruding annular beading 20 and peripherally oriented towards the exterior and towards the front. Thus, the peripheral sides 19a of the first encapsulation ring 19 form a rear part of the peripheral sides 18a of the encapsulation block 18.

The encapsulation block 18 also comprises a second encapsulation ring 25 which fills the peripheral groove 24 of the first encapsulation ring 19.

The second encapsulation ring 25 has peripheral sides 25a which form the front parts of the peripheral sides 18a of the encapsulation block 18 and has a flat front face 26 substantially parallel to the base wafer 2 and which extends substantially in the same plane as the front peak 27 of the protruding annular beading 20 and as far as this front peak 27, in such a manner that the second encapsulation ring 25 configures the front corner of the electronic device 1.

According to the example shown, the protruding annular beading 20 leaves a free central region 28 situated opposite the sensor 7 and whose surface area is greater than that of this sensor 7.

According to one variant embodiment, the protruding annular beading 20 could be formed on the outside and in a manner adjacent to the peripheral edge of the protection wafer 12. In this case, the entire front face 22 of the protection wafer 12 would remain uncovered.

One mode of fabrication of the electronic device 1 will now be described with reference to FIGS. 2 to 6.

Figure 2:
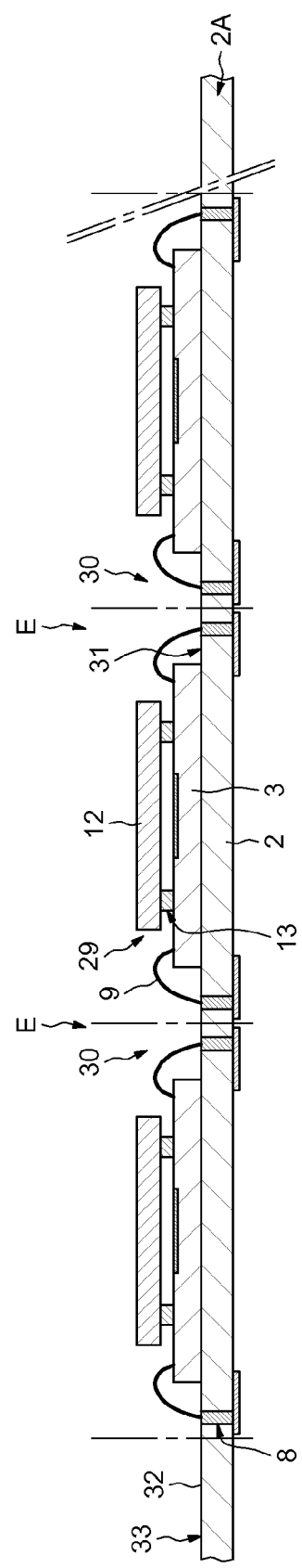

As illustrated in FIG. 2, with a view to a collective fabrication, a wafer 2A is provided with a plurality of adjacent locations E, in the form of a square matrix, in each of which it is equipped with an electrical connection network 8.

An integrated circuit chip 3 is transferred and fixed onto the front face of each of the locations E of the wafer 2A, by means of a thin layer of adhesive.

Then, the connection wires 9 are installed, as previously described.

Subsequently, protection wafers 12 are installed by transferring and fixing on top of the chips 3 installed by means of attachment and filling means 13, such as previously described.

Thus, in the locations E, stacked assemblies 29 respectively comprising a chip 3 and a protection wafer 12 are formed on top of the portions of the base wafer 2A, these portions corresponding at a later stage to base wafers of support 2.

Thus, there exist channels 30 running between the stacked assemblies 29, forward of corresponding regions 31 on the front face 32 of the base wafer 2A and there exists a peripheral area 33 of this front face 31 that surrounds all of the stacked assemblies 29.

Subsequently, as illustrated in FIG. 3, an outer peripheral barrier 34 is formed on the peripheral area 33 of the face 32 of the base wafer 2A, around and a distance from the plurality of stacked assemblies 29.

For this purpose, a ribbon is deposited, of a material such as an appropriate adhesive, and this material is hardened for example in an oven. A peripheral channel 35 is thus created between the stacked assemblies 29 situated at the periphery and the outer peripheral barrier 34.

Subsequently, for example by means of a dispensing syringe, a first coating material 19A is deposited in the channels 30 and in the peripheral channel 35.

This first coating material 19A is deposited in such a manner that protruding annular beading 20A is formed around the protection wafers 12 corresponding to the annular beading 20 to be formed, and that, in the channels 30 and the peripheral channel 35 and along the latter, recessed grooves 24A are formed corresponding substantially to a half of the grooves 24 to be formed.

Then, hardening of this first coating material 19A is carried out. Thus, in each of the locations E, a first encapsulation ring 19 is formed.

This hardened first coating material 19A has the particular property of being deformable. For example, the first coating material 19A may be made of a suitable adhesive resin, hardened in an oven.

Subsequently, as illustrated in FIG. 5, the assembly obtained hereinabove is placed between two plates 36 and 37 of a mold, the mold plate 36 is pressed against the back face of the base wafer 2A and the mold plate 37 sits on top of the peaks 27A of the protruding beading 20A of the first coating material 19A, so as to create sealing regions along these peaks 27A.

On the side of the protruding beading 20A, the mold plate 37 comprises a film 38 of a compressible material. In the molding position, the protruding beading 20A of the first coating material 19A has the tendency to penetrate and penetrates into the deformable film 38, thus creating annular sealing regions built up along the peaks 27A of the protruding beading 20A. Moreover, the deformable film 38 is resting on the front faces 22 of the protection wafers 12, thus also creating a local sealing face.

Thus, gaps 40 subsist between the grooves 24A and the mold plate 37.

Owing to the deformable nature of this first coating material 19A and of the film 38, the pressures exerted by the mold plate 37 on the protruding beading 20A and on the protection wafers 12 in order to obtain an isolation of the protection wafers 12 with respect to the gaps 40, do not induce or induce very little stresses within the stacked assemblies 29, notably in the chips 3.

The outer peripheral barrier 34 has a height such that it does not reach, on at least a part of its periphery, the mold plate 37 it such a manner that there subsists at least one peripheral passage 39.

Then, by an injection through at least one place on the periphery of the mold, a second coating material 25A is injected into the mold, so as to fill the spaces 35 and 40, this material being able to migrate by pressure and by capillarity. For example, the second coating material 25A can be a suitable adhesive resin, able to be hardened in an oven. Of course, the outer peripheral barrier 34 and the periphery of the mold are designed to allow the injection and the evacuation of air.

Then, the hardening of the second coating material 25A is carried out. Thus, in each of the locations E, a second encapsulation ring 25 is formed.

Subsequently, as illustrated in FIG. 6, after de-molding, rear electrical connection beads are installed 42 on rear lugs of the electrical connection networks 8.

Lastly, the electronic devices 1 obtained in each location E are diced up for example by sawing through the wafer 2A and the coating materials 19A and 25A along the lines 42 of the matrix of locations E.

According to one variant embodiment, the base wafer 2 could be replaced by a chip including an electronic circuit for processing the signals coming from the chip 3.

The present invention is not limited to the examples described hereinabove. Variant embodiments are possible without straying from the scope of the invention.

The invention claimed is:

1. A process of collective fabrication of electronic devices, comprising:
    forming a plurality of stacked assemblies respectively on adjacent locations, established in the form of a matrix, on a front face of a base wafer, each stack comprising an integrated circuit chip on top of the base wafer and a protection wafer on top of the integrated circuit chip, in such a manner that channels subsist between the stacked assemblies;
    forming an outer peripheral barrier on a peripheral area of the front face of the base wafer, around and at a distance from the plurality of stacked assemblies;
    depositing a first coating material within the channels and hardening this first coating material so as to form a first encapsulation ring, surrounding the stacked assemblies, having an annular beading protruding towards the front with respect to front faces of the protection wafers and situated in annular regions including the peripheral edges of the protection wafers, and forming, along the channels, recessed grooves with respect to the protruding annular beading, wherein the annular beading extends above the front faces of the protection wafers;
    placing a face of a mold in contact on the protruding annular beading;
    injecting a second coating material in the recessed grooves and hardening this second coating material so as to form a second encapsulation ring; and
    carrying out dicing operations along the locations in such a manner as to cut out the individual electronic devices formed in these locations.

2. The process according to claim 1, wherein placing the face of the mold in contact comprises positioning a film of a deformable material defining the face of the mold in contact with the protruding annular beading.

3. The process according to claim 1, wherein the first encapsulation ring is made of a deformable material.

4. The process according to claim 1, wherein placing the face of the mold in contact further comprises leaving a space between the outer peripheral barrier and the face of the mold.

5. An electronic device, comprising:
    a base wafer having a front face,
    an integrated circuit chip having a back face fixed onto the front face of the base wafer,
    a protection wafer situated on top of the integrated circuit chip, and
    an encapsulation block arranged around the integrated circuit chip, the protection wafer and on a peripheral part of the front face of the base wafer;
    wherein the encapsulation block comprises:
        a first encapsulation ring arranged around the chip and the protection wafer, having an annular beading protruding towards the front with respect to a front face of the protection wafer and situated in an annular region including the peripheral edge of the protection wafer, and forming a peripheral groove recessed with respect to this protruding annular beading, and
        a second encapsulation ring which fills the peripheral groove of the first encapsulation ring; and
        wherein at least a portion of the protruding annular beading is disposed above the front face of the protection wafer.

6. The device according to claim 5, wherein the second encapsulation ring has a front face situated substantially in a plane of a peak of the protruding annular beading.

7. The device according to claim 5, further comprising a structure mounting the protection wafer at a distance above the chip and for filling a free space created between the protection wafer and the chip.

8. The device according to claim 5, wherein the integrated circuit chip comprises a sensor extending opposite a central region of the protection wafer not covered by the protruding annular beading.

9. The device according to claim 8, wherein the sensor is an optical sensor and the protection wafer is transparent.

10. A method, comprising:
    mounting an integrated circuit chip on a base wafer;
    mounting a protection wafer on top of the integrated circuit chip to define a peripheral channel around the protection wafer and integrated circuit chip;
    depositing a first coating material within the peripheral channel and hardening this first coating material so as to form a first encapsulation ring having an annular beading at a peripheral edge of the protection wafer with a recessed peripheral groove, the annular beading at least partially disposed above a front face of the protection wafer;

placing a face of a mold in contact on the annular beading; and injecting a second coating material in the recessed peripheral groove and hardening this second coating material so as to form a second encapsulation ring.

11. A device, comprising:

a base wafer;

an integrated circuit chip mounted on the base wafer;

a protection wafer mounted on top of the integrated circuit chip to define a peripheral channel around the protection wafer and integrated circuit chip;

an encapsulation block arranged around the integrated circuit chip, the protection wafer and on a peripheral part of a front face of the base wafer;

wherein the encapsulation block comprises:
- a first encapsulation ring having an annular beading at a peripheral edge of the protection wafer with a recessed peripheral groove over the peripheral part of the front face of the base wafer; and
- a second encapsulation ring which fills the recessed peripheral groove of the first encapsulation ring; and
- wherein the annular beading extends above the front face of the protection wafer.

12. The device according to claim 11, wherein the second encapsulation ring has a front face positioned below a peak of the annular beading.

13. The method according to claim 10, wherein placing the face of the mold in contact comprises positioning a film of a deformable material defining the face of the mold in contact with the annular beading.

14. The method according to claim 10, wherein the first encapsulation ring is made of a deformable material.

15. The process according to claim 1, wherein the protruding annular beading covers peripheral areas of the front faces of the protection wafers.

16. The device according to claim 5, wherein the protruding annular beading covers a peripheral area of the front face of the protection wafer.

17. The method according to claim 10, wherein the annular beading covers a peripheral area of the front face of the protection wafer.

18. The device according to claim 11, wherein the annular beading covers a peripheral area of the front face of the protection wafer.

* * * * *